United States Patent [19]
Van Oort

[11] Patent Number: 5,923,235
[45] Date of Patent: Jul. 13, 1999

[54] SHIM ASSEMBLY FOR A POLE FACE OF A MAGNET

[75] Inventor: Johannes Martinus Van Oort, Niskayuna, N.Y.

[73] Assignee: General Electric Company, Schenectady, N.Y.

[21] Appl. No.: 09/178,320

[22] Filed: Oct. 23, 1998

[51] Int. Cl.$^6$ .............................. G01V 3/00; G01R 33/20
[52] U.S. Cl. ........................ 335/301; 324/320; 335/298
[58] Field of Search .......................... 335/216, 296–306; 324/318–320

[56] References Cited

U.S. PATENT DOCUMENTS

| | | | |
|---|---|---|---|
| 5,061,897 | 10/1991 | Danby et al. ............................ | 324/318 |
| 5,124,651 | 6/1992 | Danby et al. ............................ | 324/318 |
| 5,317,298 | 5/1994 | Dorri et al. .............................. | 335/301 |
| 5,345,208 | 9/1994 | Dorri et al. .............................. | 335/301 |
| 5,446,434 | 8/1995 | Dorri et al. .............................. | 335/301 |
| 5,627,471 | 5/1997 | Kinanen ................................. | 324/319 |
| 5,677,854 | 10/1997 | Dorri ....................................... | 364/578 |

*Primary Examiner*—Michael L. Gellner
*Assistant Examiner*—Raymond Barrera
*Attorney, Agent, or Firm*—Douglas E. Erickson; Marvin Snyder

[57] ABSTRACT

A shim assembly for a pole face of a magnet. A non-magnetizable shim tray may be positioned proximate, and preferably is attachable to, the pole face. The positioned shim tray has a surface hole having longitudinally adjacent first and second portions. The second portion has a generally circular circumference. The first portion has a perimeter generally identical to the circumference but with, for example, a flat region. A shim holder has a perimeter generally identical to the perimeter of the first portion so that it may be inserted through the first portion and into the second portion of the surface hole. A predetermined shim is removably attachable to the shim holder. The inserted shim holder, with the attached shim, is rotatable, and, when so rotated, the flat regions of the perimeters of the shim holder and the second portion of the surface hole are misaligned.

20 Claims, 3 Drawing Sheets

SHIM ASSEMBLY FOR A POLE FACE OF A MAGNET

BACKGROUND OF THE INVENTION

The present invention relates generally to magnets, and more particularly to a shim assembly for reducing magnetic field inhomogeneity in a magnet having a pole piece.

Magnets include those having spaced-apart first and second pole pieces with generally opposing first and second pole faces, such as (but not limited to) "C"-shaped magnets. Some magnet applications, such as magnetic resonance imaging (MRI) for medical diagnostics, employ superconducting magnets to generate a high strength magnetic field within an imaging volume located between the pole pieces. The imaging volume must have a low magnetic field inhomogeneity for high quality imaging. Known techniques for reducing the magnetic field inhomogeneity within the imaging volume include using shimming rings attached to each pole face to reduce axisymmetric magnetic field inhomogeneity and using shims adhesively bonded to a shim tray attached to the shimming rings to reduce 3D (three-dimensional) magnetic field inhomogeneity (including non-axisymmetric inhomogeneity and any remaining axisymmetric inhomogeneity). The number, mass, and position of the shims on the pole face are determined by shimming techniques known to those skilled in the art. Adhesively bonding a shim to the shim tray is time consuming as the shim must be manually held in place, against the magnetic field, until the adhesive sets. Reshimming the magnet requires debonding the attached shim and cleaning the removed shim and the attachment area on the pole face.

What is needed is a shim assembly for a pole face of a magnet wherein the shims are more quickly and easily installed and removed.

BRIEF SUMMARY OF THE INVENTION

In a first embodiment, the shim assembly of the invention includes a non-magnetizable shim tray, a generally circular first shim holder, and a first shim. The shim tray is positionable proximate a pole face of a magnet, has a generally circular first surface hole having a first axis which is generally parallel to the longitudinal axis of the pole face when the shim tray is positioned proximate the pole face, and has an opening which faces away from the pole face when the shim tray is positioned proximate the pole face. The first surface hole has a first portion and a longitudinally adjacent second portion which is closer than the first portion to the pole face when the shim tray is positioned proximate the pole face. The second portion has a generally circular circumference including a first segment. The first portion has a perimeter including a first region generally identical to the first segment and including a second region (such as a flat region) which is adjacent the first region and which is located closer than the first region to the first axis. The first shim holder has a perimeter generally identical to the perimeter of the first portion of the first surface hole, and the first shim holder is generally coaxially alignable with and positionable in the second portion of the first surface hole. The second region of the perimeters of the first shim holder and the second portion of the first surface hole are rotationally misalignable about the first axis. The first shim is removably attachable to the first shim holder. In one construction, the first shim holder has a generally circular first hole, and the first shim has a general circularly-cylindrical shape and is press-fittable into the first hole.

In a second embodiment, the shim assembly of the invention includes a non-magnetizable shim tray, a generally circular first shim holder, and a predetermined first shim. The shim tray is positioned proximate a pole face of a magnet, has a generally circular first surface hole which has a first axis generally parallel to the longitudinal axis of the pole face, and has an opening facing away from the pole face. The first surface hole has a first portion and a longitudinally adjacent second portion which is closer than the first portion to the pole face and which has a generally circular circumference including a first segment. The first portion has a perimeter including a first region generally identical to the first segment and including a second region (such as a flat region) which is adjacent the first region and which is located closer than the first region to the first axis. The first shim holder has a perimeter generally identical to the perimeter of the first portion of the first surface hole, and the first shim holder is generally coaxially aligned with and positioned in the second portion of the first surface hole. The second region of the perimeters of the first shim holder and the first portion of the first surface hole are rotationally misaligned about the first axis. The first shim is removably attached to the first shim holder. In one construction, the first shim holder has a generally circular first hole, and the first shim has a general circularly-cylindrical shape and is press-fit into the first hole. In another construction, additional predetermined shims are removably attached to additional shim holders positioned one or more each in additional surface holes of the shim tray.

Several benefits and advantages are derived from the invention. Shims are quickly attached to a shim holder such as by press-fitting the shims into holes in the shim holder. Shim holders are quickly installed in the shim tray by rotationally aligning the second region (e.g., a flat region) of the perimeters of the shim holder and the first portion of the surface hole, then longitudinally inserting the shim holder through the first portion and into the second portion, and then rotationally misaligning the second region (e.g., a flat region) of the perimeters of the shim holder and the first portion of the surface hole. The shim holder is quickly removed in reverse order. It is estimated that the time for shimming a magnet having opposing pole pieces may be reduced from about forty hours to about eight hours.

DETAILED DESCRIPTION OF THE INVENTION

Figure 1:
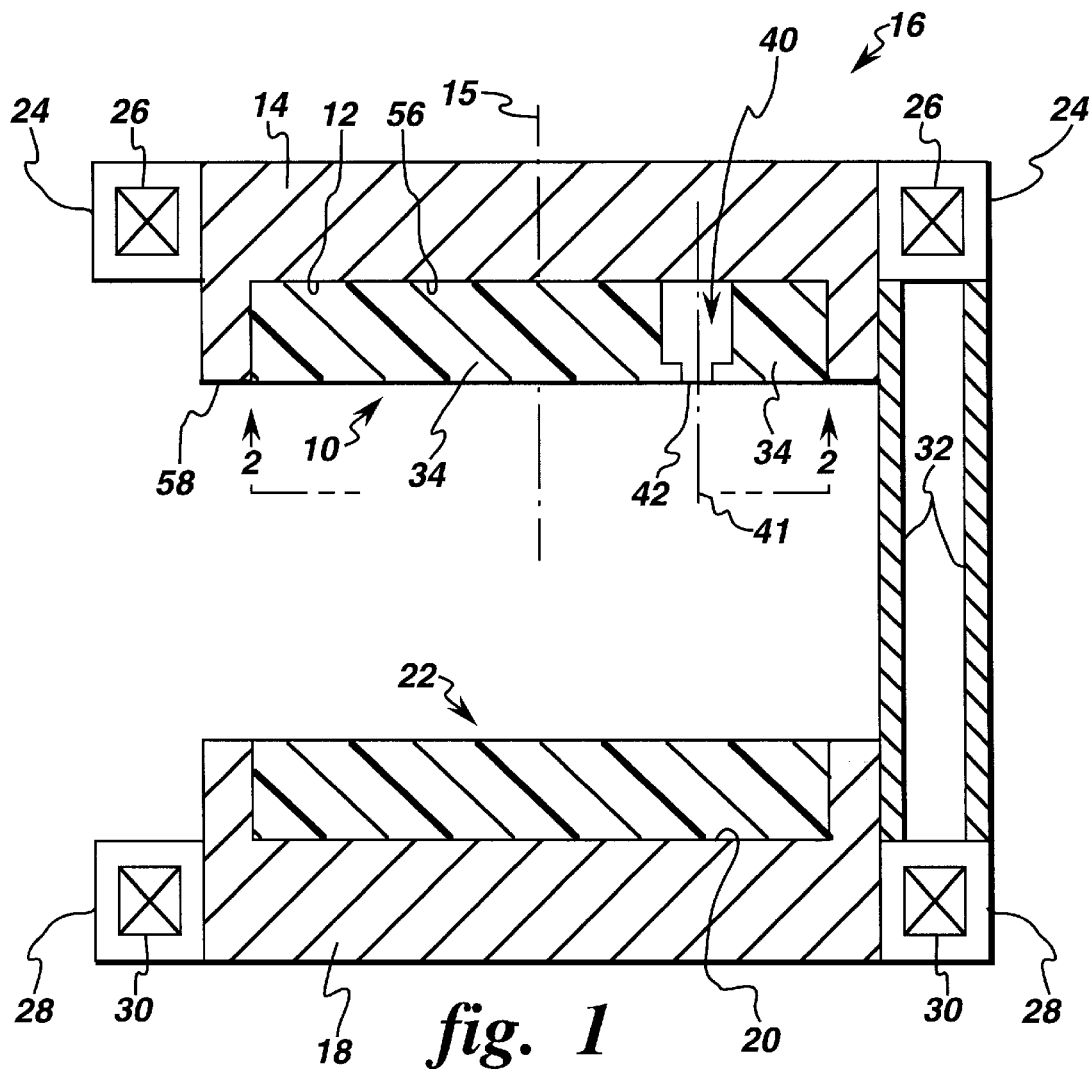
FIG. 1 is a schematic cross sectional view of a first embodiment of the shim assembly of the invention shown attached to a pole face of a magnet, wherein, for clarity, only one surface hole of the shim tray is shown and wherein the surface hole is shown devoid of a shim holder.

Referring now to the drawings, wherein like numerals represent like elements throughout, FIGS. 1–7 show a first embodiment of the shim assembly 10 of the present invention. The shim assembly 10 is for a pole face 12 of a pole piece 14 of a magnet 16, wherein the pole face 12 has a longitudinal axis 15. Table MRI (magnetic resonance imaging) magnet designs (not shown) are known that have only one pole face. However, typically the magnet 16 will include a second opposing and generally identical pole piece 18 with a generally identical pole face 20 and a second shim assembly 22. Other known magnet designs (not shown) have additional pole pieces with additional pole faces which would receive additional shim assemblies as can be appreciated by those skilled in the art. For purposes of illustration, the magnet 10 shown in FIG. 1 will be described as a superconductive magnetic resonance imaging (MRI) magnet having an imaging volume located between the pole faces 12 and 20 and typically centered on the longitudinal axis 15, but it is understood that the shim assembly 10 of the invention can be used for any magnet having a pole face and is not limited to a superconductive magnet or to a magnet which is part of an MRI imaging system.

The magnet 16 includes a vacuum enclosure 24 containing a superconductive coil 26 and surrounding the pole piece 14 and includes a second vacuum enclosure 28 containing a second superconductive coil 30 and surrounding the second pole piece 18. Coil supports, additional superconductive coils, (including main, bucking, and shielding coils) and one or more thermal shields, all omitted from the figures for clarity, may be disposed within the vacuum enclosures 24 and 28 as is known to the artisan. The superconductive coils may be cooled by a liquid cryogen (e.g., liquid helium) or by a cryocooler coldhead, such cooling not shown and being known to those skilled in the art. A non-magnetizable support member 32 (such as a non-magnetic stainless steel support member) connects the pole piece 14 and the vacuum enclosure 24 with the second pole piece 18 and the second vacuum enclosure 28.

The shim assembly 10 includes a non-magnetizable shim tray 34, a generally circular first shim holder 36, and a predetermined first shim 38. The shim tray 34 is disposed proximate the pole face 12 and preferably, but not necessarily, is attached to the pole face 12. Such attachment may occur during pole face manufacture or such attachment may occur to retrofit an existing pole face with a shim assembly. Such attachment includes suitable bolting, adhesive bonding, and the like, as is known to the artisan. It is noted that the shim tray may be attached, alternatively, to the support member, elsewhere on the pole piece, or even to the floor, etc.

Figure 3:
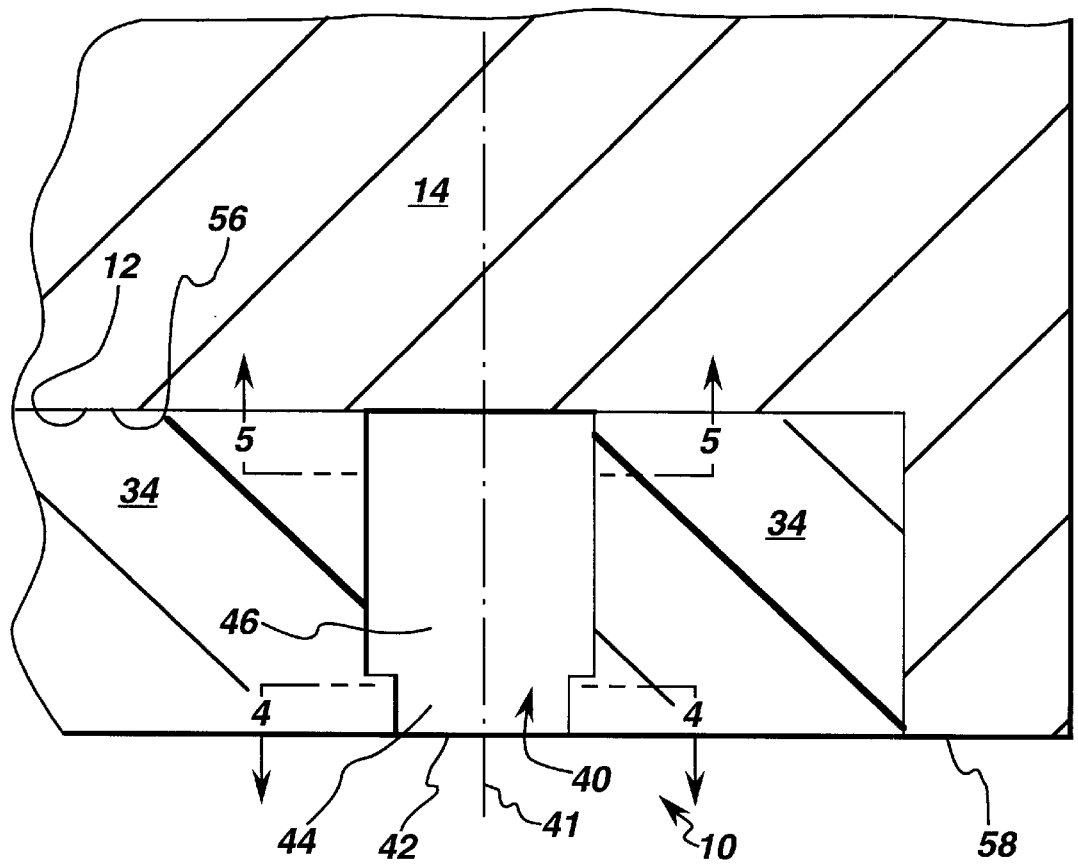
FIG. 3 is an enlarged view of the surface hole portion of FIG. 1.
Figure 4:
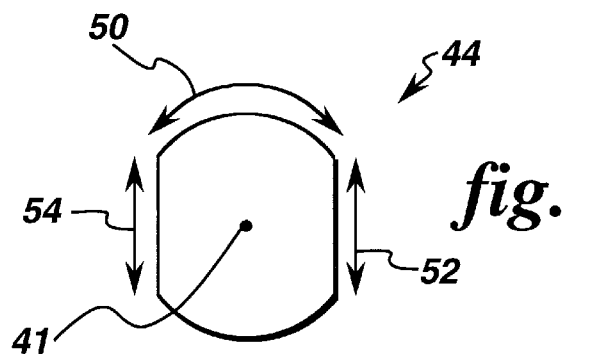
FIG. 4 is a view of the perimeter of the first portion of the surface hole of FIG. 3 taken along lines 4—4 of FIG. 3.
Figure 5:
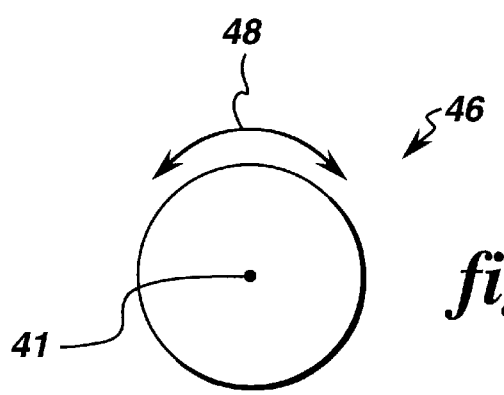
FIG. 5 is a view of the circumference of the second portion of the surface hole of FIG. 3 taken along lines 5—5 of FIG. 3.

The shim tray 34 has a generally circular first surface hole 40 which has a first axis 41 generally parallel to the longitudinal axis 15 and which has an opening 42 facing away from the pole face 12. The first surface hole 40 has a first portion 44 and a longitudinally adjacent second portion 46 which is closer than the first portion 44 to the pole face 12. The second portion 46 (as shown in FIG. 3) has a generally circular circumference including a first segment 48 (as shown in FIG. 5). The first portion 44 (as shown in FIG. 3) has a perimeter including a first region 50 generally identical to the first segment 48 and includes a second region 52 which is adjacent the first region 50 and which is disposed closer than the first region 50 to the first axis 41 (as shown in FIG. 4). In one construction, the second region 52 is a flat region as seen in FIG. 4. In another construction, the perimeter of the first portion 44 includes a third region 54 (as shown in FIG. 4) which is generally identical to and disposed diametrically opposite from the second region 52 and wherein the third region 54 is adjacent the first region 50. In a typical construction, the second portion 46 of the first surface hole 40 longitudinally extends to the pole face 12.

Figure 2:
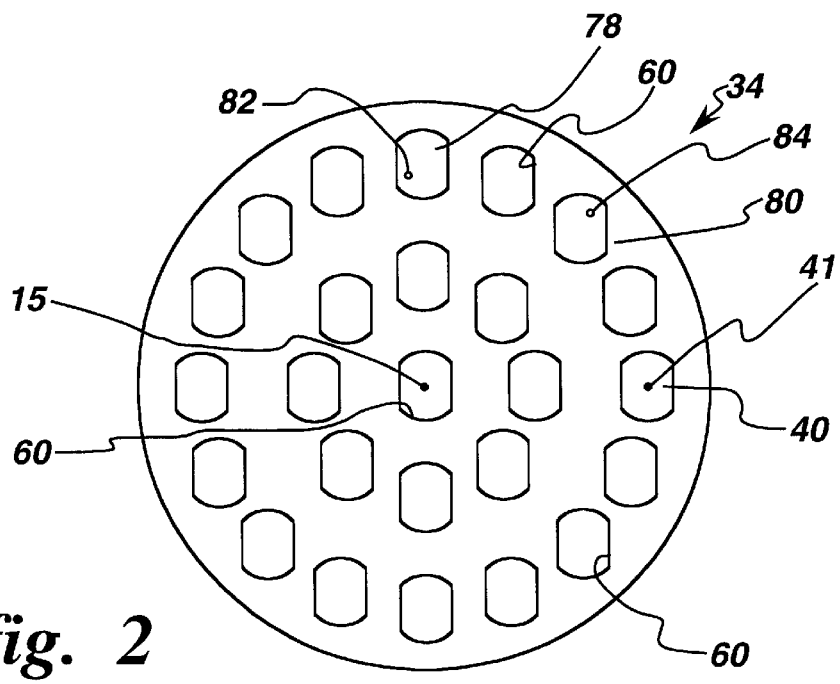
FIG. 2 is a schematic top planar view of the pole face of FIG. 1 taken along lines 2—2 of FIG. 1 showing many surface holes.

In one design, the pole face 12 has a central region 56 and an adjacent annular peripheral region 58. The central circular region 56 is longitudinally recessed relative to the adjacent annular peripheral region 58, and wherein the shim tray 34 is attached to the central circular region 56. It is noted that the pole piece 14 may, without limitation, be solid iron or have a solid iron substrate covered with alternating amorphous steel and epoxy laminations. In one construction, the shim tray 34 comprises FRP (a fiber reinforced plastic such as a glass fiber epoxy) with the first surface hole 40 created by a plug which is removed after the epoxy has cured, as can be appreciated by the artisan. In a typical construction, the shim tray 34 has a plurality of generally circular additional surface holes 60 generally identical to the first surface hole 40 wherein the first surface hole 40 and the additional surface holes 60 together are generally axisymmetrically arrayed about the longitudinal axis 15, as seen in FIG. 2.

Figure 6:
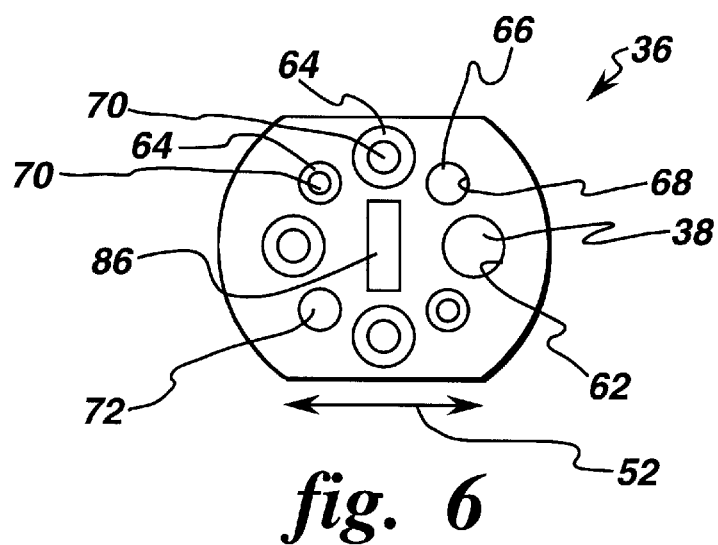
FIG. 6 is a schematic top planar view of a shim holder.
Figure 7:
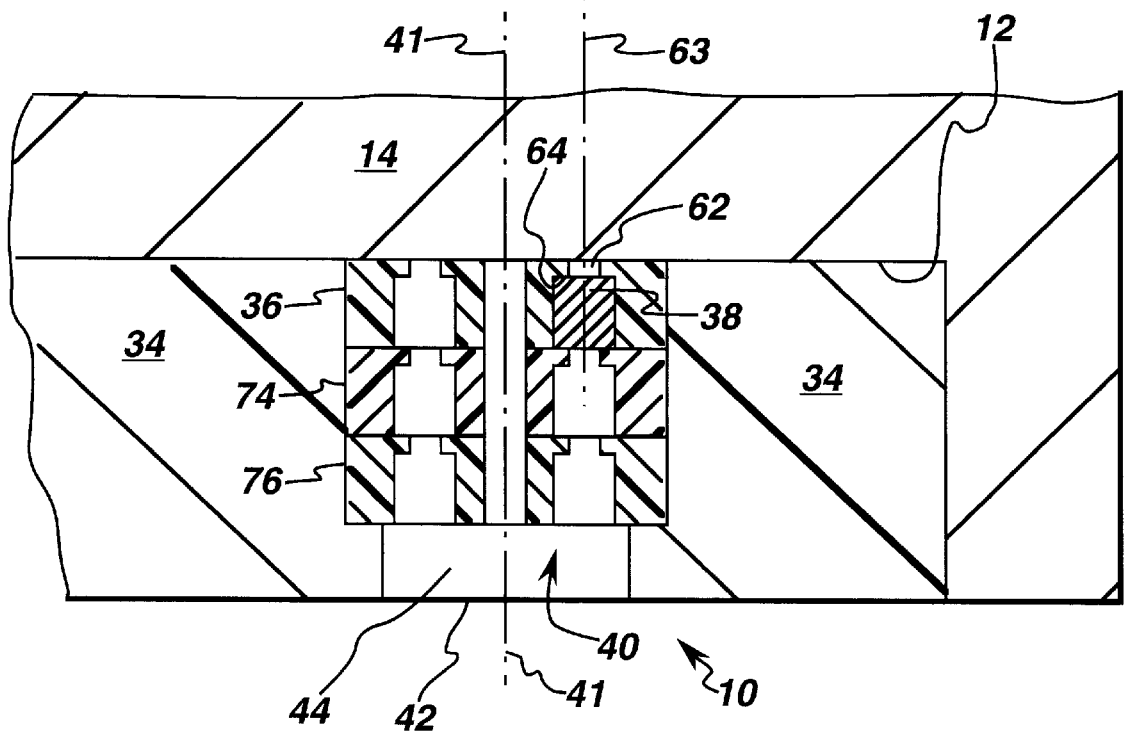
FIG. 7 is a schematic cross sectional view of FIG. 3 with three shim holders installed in the surface hole of the shim tray and with one shim press-fit into a hole of one of the shim holders.

The first shim holder 36, as seen in FIG. 6, has a perimeter generally identical to the perimeter of the first portion 44 of the first surface hole 40, and the first shim holder 36 is generally coaxially aligned with, and disposed in, the second portion 46 of the first surface hole 40 as seen in FIG. 7. The second region 52 of the perimeters of the first shim holder 36 and the first portion 44 of the first surface hole 40 are rotationally misaligned (compare the rotational misalignment between the flat regions of FIGS. 6 and 4) about the first axis 41. In one construction, the first shim holder 36 is a non-magnetizable shim holder consisting essentially of injection-molded plastic, such as NORYL-731 plastic.

The first shim 38 is removably attached to the first shim holder 36. In one construction, the shims are cast shims consisting essentially of low carbon steel. In one design, the first shim holder 36 has a generally circular first hole 62 having an axis 63 generally parallel to the first axis 41, wherein the first shim 38 has a general circularly-cylindrical shape and is press-fit into the first hole 62. In another construction, the first hole 62 has a bottom rim 64, and the first shim 38 longitudinally abuts the bottom rim 64.

In one construction, the shim assembly 10 also includes a predetermined second shim 66, the first shim holder 36 has a generally circular second hole 68 having an axis generally parallel to the first axis 41, and the second shim 66 has a general circularly-cylindrical shape and is press-fit into the second hole 68. In a second construction, the first shim 38 has a first diameter, and the second shim 66 has a second diameter which is smaller than the first diameter, as seen in FIG. 6. In another construction, the first shim holder 36 has a plurality of generally circular additional holes 70, wherein the first and the additional holes 62 and 70 are axisymmetrically arrayed about the first axis 41. Here, the shim assembly 10 also includes at least one additional predetermined shim 72, and the first shim 38 and the at least one additional predetermined shim 72 are non-axisymmetrically arrayed one each in some of the first and the additional holes 62 and 70.

In one design, the shim assembly 10 also includes at least one additional generally circular shim holder 74 and 76 having a perimeter generally identical to the perimeter of the first shim holder 36. Here, the at least one additional generally circular shim holder 74 and 76 is disposed in the second portion 46 of the first surface hole 40 between the pole face 12 and the first portion 44 of the first surface hole 40, as seen in FIG. 7. In one construction, the first shim holder 36 has a first longitudinal thickness, and the at least one additional generally circular shim holder 74 and 76 has a longitudinal thickness generally identical to the first longitudinal thickness. Here, the second portion 46 of the first surface hole 40 has a longitudinal length generally equal to an integer number of the first longitudinal thicknesses.

In one embodiment, the shim assembly 10 has generally circular additional shim holders 78 and 80 generally identical to the first shim holder 36, and the shim assembly 10 also has a plurality of predetermined additional shims 82 and 84. The additional shims 82 and 84 are removably attached to the additional shim holders 78 and 80. The additional shim holders 78 and 80 are disposed in some of the additional surface holes 60 as seen in FIG. 2.

The second shim assembly 22 is identical to the first shim assembly 10 but typically with a different number, mass, and location of shims and with a different number of used shim holders, as is understood by those skilled in the art of shimming magnets. Once the shims have been calculated, they are referred to as predetermined shims. Then, the predetermined shims are attached to the shim holders which now may be referred to as loaded shim holders. Next, each loaded shim holder (and any unloaded shim holders used as spacers in the surface hole) is taken to the corresponding surface hole, coaxially aligned with the axis of the surface hole, and rotated such that the flat regions of the loaded shim holder and the first portion of the surface hole are aligned. Then, the loaded shim holder is inserted (by using, for example, a tweezer-like tool (not shown) inserted into a slot 86 in the shim holder) through the first portion and into the second portion of the surface hole. Finally, the loaded shim holder is rotated (by the tweezer-like tool) to misalign the flat regions of the loaded shim holder and the first portion the surface hole to secure the shim holder in the surface hole. Disassembly is in reverse order. It is estimated that the time for shimming a magnet having opposing pole pieces may be reduced from about forty hours to about eight hours.

The shim assembly 10 of the invention has been previously described in a completely assembled state and as being installed in the magnet 16 with the shim tray 34 disposed proximate and preferably, but not necessarily, attached to the pole face 12, with the first shim holder 36 disposed in the first surface hole 40, and with the first shim 38 removably attached to the first shim holder 36. The shim assembly 10 of the invention is hereinafter described in an uninstalled and disassembled state. It is noted that the shim tray 34 may be manufactured with the pole piece 14 or may be retrofitted to an existing pole piece 14, as can be appreciated by the artisan.

The shim assembly 10 is for a pole face 12 of a magnet 16, wherein the pole face 12 has a longitudinal axis 15. The shim assembly includes a non-magnetizable shim tray 34 disposable proximate the pole face 12, wherein the shim tray has a generally circular first surface hole 40 having a first axis 41 which is generally parallel to the longitudinal axis 15 when the shim tray 34 is disposed proximate the pole face 12 and having an opening 42 which faces away from the pole face when the shim tray 34 is disposed proximate the pole face 12. The first surface hole 40 has a first portion 44 and a longitudinally adjacent second portion 46 which is closer than the first portion 44 to the pole face 12 when the shim tray is disposed proximate the pole face 12. The second portion 46 has a generally circular circumference including a first segment 48, and the first portion 44 has a perimeter including a first region 50 generally identical to the first segment 48 and including a second region 52 which is adjacent the first region 50 and which is disposed closer than the first region 50 to the first axis 41.

The shim assembly 10 also includes a generally circular first shim holder 36 which has a perimeter generally identical to the perimeter of the first portion 44 of the first surface hole 40, and the first shim holder 36 is generally coaxially alignable with, and disposable in, the second portion 46 of the first surface hole 40. The second region 52 of the perimeters of the first shim holder 36 and the first portion 44 of the first surface hole 40 are rotationally misalignable about the first axis 41.

The shim assembly 10 further includes a first shim 38 removably attachable to the first shim holder 36. In a first construction, the first shim holder 36 has a generally circular first hole 62 having an axis 63 which is generally parallel to the first axis 41 when the first shim holder 38 is generally coaxially aligned with, and disposed in, the second portion 46 of the first surface hole 40. Here, the first shim 38 has a general circularly-cylindrical shape and is press-fittable into the first hole 62. In another construction, the first hole 62 has a bottom rim 64, and the first shim 38 longitudinally abuts the bottom rim 64 when the first shim 38 is press-fit into the first hole 62 and when the first shim holder 36 is generally coaxially aligned with, and disposed in, the second portion 46 of the first surface hole 40.

It is noted that attachment of the shim tray to the pole piece may be a direct or an indirect attachment, and that the magnet may include conventional shimming rings and/or coils (not shown) disposed between the shim tray and the pole piece.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

I claim:

1. A shim assembly for a pole face of a magnet, said pole face having a longitudinal axis, and said shim assembly comprising:

a) a non-magnetizable shim tray disposable proximate said pole face, wherein said shim tray has a generally circular first surface hole having a first axis which is generally parallel to said longitudinal axis when said shim tray is disposed proximate said pole face and having an opening which faces away from said pole face when said shim tray is disposed proximate said pole face, wherein said first surface hole has a first portion and a longitudinally adjacent second portion which is closer than said first portion to said pole face when said shim tray is disposed proximate said pole face, wherein said second portion has a generally circular circumference including a first segment, and wherein said first portion has a perimeter including a first region generally identical to said first segment and including a second region which is adjacent said first region and which is disposed closer than said first region to said first axis;

b) a generally circular first shim holder which has a perimeter generally identical to said perimeter of said first portion of said first surface hole and which is generally coaxially alignable with and disposable in said second portion of said first surface hole, and wherein said second region of said perimeters of said first shim holder and said first portion of said first surface hole are rotationally misalignable about said first axis; and c) a first shim removably attachable to said first shim holder.

2. The shim assembly of claim 1, wherein said first shim holder is a non-magnetizable shim holder.

3. The shim assembly of claim 1, wherein said second region is a flat region.

4. The shim assembly of claim 1, wherein said first shim holder has a generally circular first hole having an axis which is generally parallel to said first axis when said first shim holder is generally coaxially aligned with and disposed in said second portion of said first surface hole, and wherein said first shim has a general circularly-cylindrical shape and is press-fittable into said first hole.

5. The shim assembly of claim 4, wherein said first hole has a bottom rim, and wherein said first shim longitudinally abuts said bottom rim when said first shim is press-fit into said first hole and when said first shim holder is generally coaxially aligned with and disposed in said second portion of said first surface hole.

6. A shim assembly for a pole face of a magnet, said pole face having a longitudinal axis, and said shim assembly comprising:
   a) a non-magnetizable shim tray disposed proximate said pole face, wherein said shim tray has a generally circular first surface hole which has a first axis generally parallel to said longitudinal axis and which has an opening facing away from said pole face, wherein said first surface hole has a first portion and a longitudinally adjacent second portion which is closer than said first portion to said pole face, wherein said second portion has a generally circular circumference including a first segment, and wherein said first portion has a perimeter including a first region generally identical to said first segment and including a second region which is adjacent said first region and which is disposed closer than said first region to said first axis;
   b) a generally circular first shim holder which has a perimeter generally identical to said perimeter of said first portion of said first surface hole and which is generally coaxially aligned with and disposed in said second portion of said first surface hole, and wherein said second region of said perimeters of said first shim holder and said first portion of said first surface hole are rotationally misaligned about said first axis; and
   c) a predetermined first shim removably attached to said first shim holder.

7. The shim assembly of claim 6, wherein said first shim holder is a non-magnetizable shim holder.

8. The shim assembly of claim 6, wherein said shim tray has a plurality of generally circular additional surface holes generally identical to said first surface hole, wherein said shim assembly has generally circular additional shim holders generally identical to said first shim holder, wherein said first and said additional surface holes are generally axisymmetrically arrayed about said longitudinal axis, wherein said shim assembly has a plurality of predetermined additional shims, wherein said additional shims are removably attached to said additional shim holders, and wherein said additional shim holders are disposed in some of said additional surface holes.

9. The shim assembly of claim 6, wherein said pole face has a central circular region and an adjacent annular peripheral region, wherein said central circular region is longitudinally recessed relative to said adjacent annular peripheral region, and wherein said shim tray is attached to said central circular region.

10. The shim assembly of claim 6, wherein said shim assembly is attached to said pole face, and wherein said magnet is a superconductive magnetic resonance imaging magnet.

11. The shim assembly of claim 6, wherein said first shim holder has a generally circular first hole having an axis generally parallel to said first axis, and wherein said first shim has a general circularly-cylindrical shape and is press-fit into said first hole.

12. The shim assembly of claim 11, wherein said first hole has a bottom rim, and wherein said first shim longitudinally abuts said bottom rim.

13. The shim assembly of claim 11, wherein said first shim holder has a plurality of generally circular additional holes, wherein said first and said additional holes are axisymmetrically arrayed about said first axis, wherein said shim assembly also includes at least one additional predetermined shim, and wherein said first shim and said at least one additional predetermined shim are non-axisymmetrically arrayed one each in some of said first and said additional holes.

14. The shim assembly of claim 11, also including a predetermined second shim, wherein said first shim holder has a generally circular second hole having an axis generally parallel to said first axis, and wherein said second shim has a general circularly-cylindrical shape and is press-fit into said second hole.

15. The shim assembly of claim 14, wherein said first shim has a first diameter, and wherein said second shim has a second diameter which is smaller than said first diameter.

16. The shim assembly of claim 6, also including at least one additional generally circular shim holder having a perimeter generally identical to said perimeter of said first shim holder, and wherein said at least one additional generally circular shim holder is disposed in said second portion of said first surface hole between said pole face and said first portion of said first surface hole.

17. The shim holder of claim 16, wherein said first shim holder has a first longitudinal thickness, wherein said at least one additional generally circular shim holder each has a longitudinal thickness generally identical to said first longitudinal thickness, wherein said second portion of said first surface hole has a longitudinal length generally equal to an integer number of said first longitudinal thicknesses.

18. The shim assembly of claim 17, wherein said second portion of said first surface hole longitudinally extends to said pole face.

19. The shim assembly of claim 6, wherein said second region is a flat region.

20. The shim assembly of claim 19, wherein said perimeter of said first portion includes a third region which is generally identical to and disposed diametrically opposite from said second region and wherein said third region is adjacent said first region.

* * * * *